United States Patent
Li et al.

(10) Patent No.: US 8,618,832 B2
(45) Date of Patent: Dec. 31, 2013

(54) BALANCED SINGLE-ENDED IMPEDANCE CONTROL

(75) Inventors: Miao Li, San Diego, CA (US); Nam V. Dang, San Diego, CA (US); Xiaohua Kong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 21 days.

(21) Appl. No.: 13/197,128

(22) Filed: Aug. 3, 2011

(65) Prior Publication Data
US 2013/0033287 A1 Feb. 7, 2013

(51) Int. Cl.
*H03K 19/003* (2006.01)
*H03K 19/0175* (2006.01)

(52) U.S. Cl.
USPC .................. 326/30; 326/83; 326/86; 375/259

(58) Field of Classification Search
USPC ........................................................... 326/30
See application file for complete search history.

(56) References Cited

U.S. PATENT DOCUMENTS

| | | | |
|---|---|---|---|
| 5,514,983 A * | 5/1996 | Yoshino | 326/86 |
| 6,025,742 A * | 2/2000 | Chan | 327/108 |
| 6,218,884 B1 * | 4/2001 | Chiu | 327/376 |
| 6,307,424 B1 * | 10/2001 | Lee | 327/530 |
| 6,313,662 B1 * | 11/2001 | Ide | 326/83 |
| 6,560,290 B2 * | 5/2003 | Ahn et al. | 375/259 |
| 6,577,154 B2 * | 6/2003 | Fifield et al. | 326/30 |
| 6,867,618 B2 | 3/2005 | Li et al. | |
| 7,019,554 B2 * | 3/2006 | Kiehl et al. | 326/30 |
| 7,619,448 B2 | 11/2009 | Wu et al. | |
| 7,679,396 B1 | 3/2010 | Kao | |
| 7,750,666 B2 * | 7/2010 | Zhang et al. | 326/30 |
| 7,821,290 B2 | 10/2010 | Thomsen | |

(Continued)

FOREIGN PATENT DOCUMENTS

| | | |
|---|---|---|
| WO | 2010111619 A2 | 9/2010 |
| WO | 2011049693 A2 | 4/2011 |

OTHER PUBLICATIONS

Thomas F. Knight Jr. and Alexander Krymm. A Self-Terminating Low-Voltage Swing CMOS Output Driver. IEEE Journal of Solid-State Circuits, 23(2), Apr. 1988.*

(Continued)

*Primary Examiner* — Shawki Ismail
*Assistant Examiner* — Nelson Correa
(74) *Attorney, Agent, or Firm* — Sam Talpalatsky; Nicholas J. Pauley; Joseph Agusta

(57) ABSTRACT

A balanced single-end impedance control system is disclosed. In a particular embodiment, the circuit includes a first transistor coupled to a first output terminal and a second transistor coupled to a second output terminal. The circuit also includes a third transistor and a fourth transistor, where device characteristics of the third transistor substantially match device characteristics of the first transistor and device characteristics of the fourth transistor substantially match device characteristics of the second transistor. The circuit further includes a first control path and a second control path. The first path is coupled to the third transistor and provides a first rail voltage to control a first gate control voltage of the first transistor. The second control path is coupled to the fourth transistor and provides a second rail voltage to control a second gate control voltage of the second transistor. The impedances of the first and second transistors may be controlled by the first gate control voltage and the second gate control voltage respectively.

41 Claims, 6 Drawing Sheets

(56) References Cited

U.S. PATENT DOCUMENTS

| | | | |
|---|---|---|---|
| 7,898,295 B1 * | 3/2011 | Kasturirangan et al. | 326/86 |
| 8,258,813 B2 * | 9/2012 | Groepl et al. | 326/82 |
| 2002/0163360 A1 | 11/2002 | Fifield et al. | |
| 2010/0253300 A1 | 10/2010 | Garez et al. | |

OTHER PUBLICATIONS

International Search Report and Written Opinion—PCT/US2012/049657—ISA/EPO—Dec. 4, 2012.*

* cited by examiner

BALANCED SINGLE-ENDED IMPEDANCE CONTROL

I. FIELD

The present disclosure is generally related to output impedance of a driver.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Wireless telephones can process executable instructions, including software applications, such as a web browser application that can be used to access the Internet. As such, these wireless telephones can include significant computing capabilities. Further, many such wireless telephones include other types of devices that are incorporated therein. For example, a wireless telephone can also include a digital still camera, a digital video camera, a digital recorder, and an audio file player. A wireless phone can also include an output port to interface with external devices. For example, a wireless phone can include an output port to connect to an external computer.

A device may interface with an external device via a driver that is included in the device and that is coupled to an output of the device. For example, a device, such as a wireless phone, may include one or more voltage mode logic (VML) drivers. A voltage mode logic (VML) driver typically has a pair of output terminals. In certain implementations, the output impedance of an output terminal of a VML driver depends on characteristics of a top transistor and a bottom transistor that are each coupled to the output terminal. During data transmission, the output impedance of each output terminal is determined based on the on-resistance (Ron) of the top transistor and the on-resistance (Ron) of the bottom transistor that are each coupled to the output terminal. An output terminal of a VML driver may have a specified output impedance that matches the impedance of a transmission line (e.g., 50 ohms) that is connected to the output terminal. However, the output impedance of each output terminal can vary based on changes in the Ron of the top transistor and in the Ron of the bottom transistor that are each coupled to the particular output terminal. For example, the Ron of a top transistor and the Ron of a bottom transistor of a VML driver can vary over process, voltage, and temperature changes. The Ron of a top transistor and the Ron of a bottom transistor can also respond differently to the same change in voltage or temperature.

III. SUMMARY

A balanced single-ended output impedance control circuit is disclosed. The balanced single-ended output impedance control circuit may include an output stage that includes a first output terminal and a second output terminal. The first output terminal may be coupled to a top transistor and to a bottom transistor. The second output terminal may be coupled to a second top transistor and to a second bottom transistor. A first bias circuit provides a gate control voltage to each bottom transistor that is coupled to an output terminal. A second bias circuit provides a gate control voltage to each top transistor that is coupled to an output terminal. The gate control voltage provided to the bottom transistors depends on a first rail voltage provided by a first control path, and the gate control voltage provided to the top transistors depends on a second rail voltage provided by a second control path. The first control path includes a transistor that has device characteristics that substantially match device characteristics of the bottom transistors that are coupled to the output terminals. The second control path includes a transistor that has device characteristics that substantially match device characteristics of the top transistors that are coupled to the output terminals. In a particular implementation, the balanced single-ended output impedance control circuit may be implemented within an output driver. For example, the balanced single-ended output impedance circuit may be implemented within a differential voltage mode logic (VML) driver.

In a particular embodiment, the circuit includes a first transistor coupled to a first output terminal and a second transistor coupled to a second output terminal. The circuit also includes a third transistor and a fourth transistor, where device characteristics of the third transistor substantially match device characteristics of the first transistor and device characteristics of the fourth transistor substantially match device characteristics of the second transistor. The circuit further includes a first control path that is coupled to the third transistor and that provides a first rail voltage to control a first gate control voltage of the first transistor and further includes a second control path that is coupled to the fourth transistor and that provides a second rail voltage to control a second gate control voltage of the second transistor.

In a particular embodiment, a method includes generating a first rail voltage at a first control path and generating a second rail voltage at a second control path. The method further includes controlling a first gate control voltage of a first transistor based on the first rail voltage, where the first transistor is coupled to a first output terminal. The first control path is coupled to a third transistor and device characteristics of the third transistor substantially match device characteristics of the first transistor. The method further includes controlling a second gate control voltage of a second transistor based on the second rail voltage, where the second transistor is coupled to a second output terminal. The second control path is coupled to a fourth transistor and device characteristics of the fourth transistor substantially match device characteristics of the second transistor.

In a particular embodiment, an apparatus includes means for generating a first rail voltage, means for generating a second rail voltage, and means for controlling a first gate control voltage of a first transistor based on the first rail voltage. The first transistor is coupled to a first output terminal. The means for generating the first rail voltage includes a third transistor and device characteristics of the third transistor substantially match device characteristics of the first transistor. The apparatus further includes means for controlling a second gate control voltage of a second transistor based on the second rail voltage. The second transistor is coupled to a second output terminal. The means for generating the second rail voltage includes a fourth transistor and device characteristics of the fourth transistor substantially match device characteristics of the second transistor.

One particular advantage provided by at least one of the disclosed embodiments is balanced single-ended impedance control of a differential voltage mode logic driver, where an impact due to variations in process, voltage, and temperature on output impedance of each output terminal seen from outside the differential voltage mode logic driver is reduced resulting in improved impedance matching to a transmission line.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
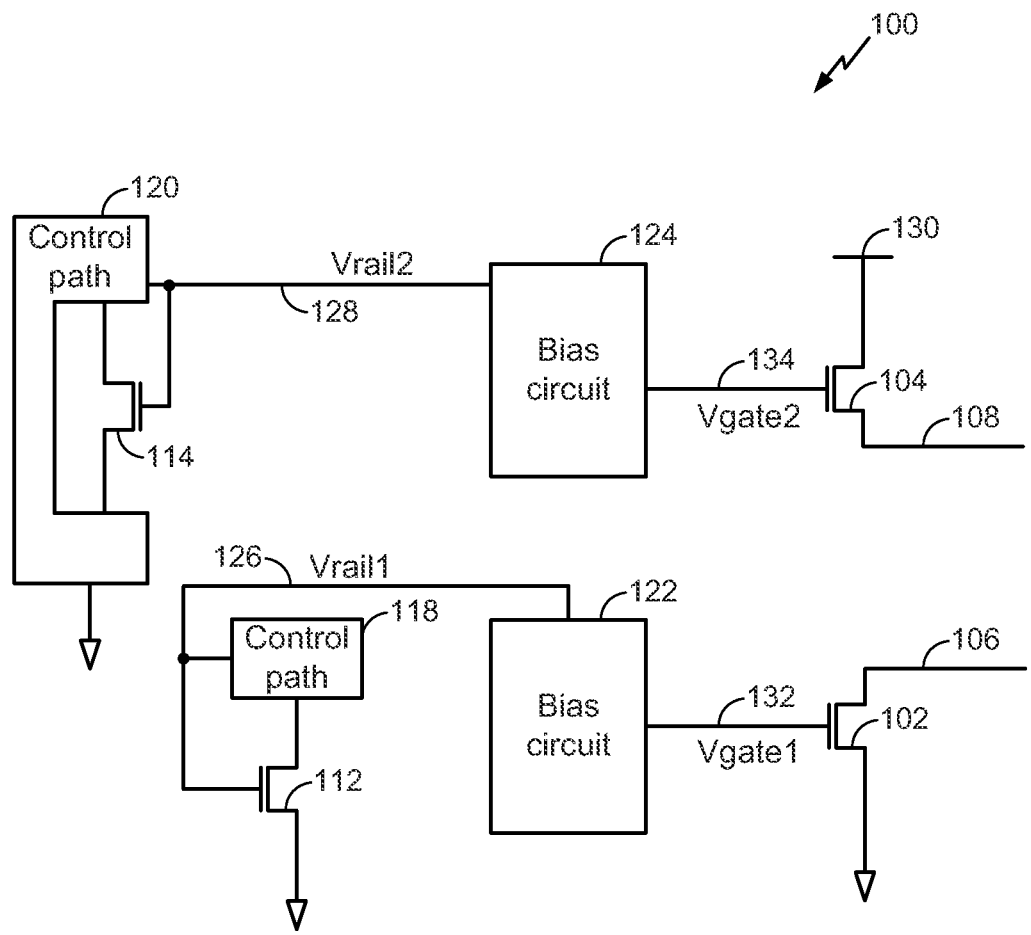
FIG. 1 is a diagram of a particular illustrative embodiment of a balanced single-ended impedance control system.

Referring to FIG. 1, a particular illustrative embodiment of a balanced single-ended impedance control system 100 is shown. The system 100 includes a first control path 118 and a second control path 120. The system 100 further includes a first bias circuit 122 and a second bias circuit 124. The first control path 118 is coupled to the bias circuit 122 via a line 126 that provides a first rail voltage (Vrail1) to the first bias circuit 122. The second control path 120 is coupled to the second bias circuit 124 via a line 128 that provides a second rail voltage (Vrail2) to the second bias circuit 124.

The first bias circuit 122 is coupled to a first transistor 102 via a first line 132 which may be used to apply a first gate control voltage (Vgate1) to a gate of the first transistor 102. The first transistor 102 is coupled to the first output terminal 106. Similarly, the system 100 includes a second transistor 104 which is coupled to a second output terminal 108. The second transistor 104 has a supply voltage 130 and has a gate that receives a second gate control voltage (Vgate2), via line 134, from the second bias circuit 124.

While FIG. 1 illustrates a single first transistor 102 coupled to the first output terminal 106, in other embodiments, the system 100 may include multiple transistors coupled to the first output terminal 106 that are arranged in a parallel configuration and each of the transistors has a gate coupled to the line 132. For example, a parallel configuration of twenty transistors that each has an impedance of 1 kilohm would produce an impedance of approximately 50 ohm at the first output terminal 106.

Similarly, while FIG. 1 illustrates a single first transistor 104 coupled to the second output terminal 108, in other embodiments, the system 100 may include multiple transistors coupled to the second output terminal 108 that are arranged in a parallel configuration and where each of the multiple transistors has a gate coupled to the line 134. For example, a parallel configuration of twenty transistors that each has an impedance of 1 kilohm would produce an impedance of approximately 50 ohm at the second output terminal 108.

The system 100 further includes a third transistor 112 that is coupled to the first control path 118. The third transistor 112 has device characteristics that substantially match device characteristics of the first transistor 102. Similarly, the system 100 includes a fourth transistor 114 that is coupled to the second control path 120. The fourth transistor 114 has device characteristics that substantially match device characteristics of the second transistor 104. In a particular embodiment, the device characteristics of the first transistor 102 include an impedance of the first transistor 102. Alternatively, the device characteristics of the first transistor 102 may include a length of a channel region of the first transistor 102 and a width of the channel region of the first transistor 102.

The first control path 118 is coupled to the third transistor 112 and provides the first rail voltage (Vrail1) to control the gate of the first transistor 102 via the line 126. The second control path 120, which is coupled to the fourth transistor 114, provides the second rail voltage (Vrail2) to control the gate of the second transistor 104 via the line 128. The device characteristics of the second transistor 104 may include a length of a channel region of the second transistor 104 and a width of the channel region of the second transistor 104.

The first control path 118 is operable to adjust the first rail voltage (Vrail1) on the line 126, and the second control path 120 is operable to adjust the second rail voltage (Vrail2) on the line 128.

During operation, the balanced single-ended impedance control system 100 generates the first rail voltage (Vrail1) at the first control path 118. The system 100 also generates the second rail voltage (Vrail2) at the second control path 120. The first bias circuit 122, responsive to the first rail voltage (Vrail1) from the first control path 118, controls the first gate control voltage (Vgate1) that is provided to the first transistor 102 via the line 132. Similarly, the second bias circuit 124, responsive to the second rail voltage (Vrail2) from the second control path 120, controls a second gate control voltage (Vgate2) that is provided to the second transistor 104 via the line 134.

Since the third transistor 112 has device characteristics that substantially match device characteristics of the first transistor 102, the first control path 118 may provide a voltage level of the first rail voltage (Vrail1) in order to provide the first gate control voltage (Vgate1), on the line 132, to the first transistor 102, thereby producing a controlled impedance at the first output terminal 106. For example, a desired impedance level of the first output terminal 106 may be 50 ohms. The first control path 118 may dynamically adjust the level of the first rail voltage (Vrail1) on the line 126 in response to voltage and temperature variations in order to substantially match the desired output impedance at the first output terminal 106.

The impedance of the third transistor 112 and the impedance of the first transistor 102 may vary as a function of voltage or temperature. The first control path 118 may respond dynamically to change in the impedance of the third transistor 112 by producing a corresponding change in the first rail voltage (Vrail1). By dynamically adjusting the first rail voltage (Vrail1), which is provided to the gate of the third transistor 112, the first control path 118 maintains the impedance of the third transistor 112 at or close to a desired impedance value of the third transistor 112, such as 1 kilohms (assuming a parallel arrangement of 20 transistors). The first rail voltage (Vrail1) is also provided to the first bias circuit 122 and the first bias circuit 122 dynamically adjusts the first gate control voltage (Vgate1). The first gate control voltage (Vgate1), which is generated responsive to the first rail voltage (Vrail1), is provided to the first transistor 102 in order to adjust and control the impedance of the first transistor 102 based on the voltage level of the first gate control voltage (Vgate1). The result of such dynamic adjustment is an impedance at the first output terminal 106 that is maintained at or substantially close to a desired impedance value of the first output terminal 106. In a particular embodiment, the desired impedance value at the first output terminal 106 is 50 ohms. In a particular embodiment, instead of the single transistor 102 shown in FIG. 1 for illustrative purposes, a parallel configuration of 20 transistors that each has device characteristics (not shown) that substantially match the device characteristics of the third transistor 112 may be used to produce an output impedance of 50 ohms at the first output terminal 106. Further, in a particular embodiment, the first transistor 102 may operate in a deep triode region of operation to produce the desired impedance at the first output terminal 106. Similarly, in a particular embodiment, all transistors that form a parallel configuration may operate in a deep triode region.

Similarly, the second control path 120 is coupled to the fourth transistor 114, which has device characteristics that substantially match device characteristics of the second transistor 104. The second control path 120 may monitor the impedance of the fourth transistor 114 and may dynamically adjust the voltage level of the second voltage rail (Vrail2) on the line 128. The second bias circuit 124, in response to the voltage level of the second rail voltage (Vrail2) provided by the second control path 120, adjusts the second gate control voltage (Vgate2) that is provided to the second transistor 104 via the line 134. In this manner, the second control path 120 may respond to temperature or voltage variations in a dynamic manner to adjust the impedance of the second transistor 104, producing a controlled output impedance at the second terminal 108. In a particular embodiment, the second transistor 104 operates in a deep triode region.

Since the first control path 118 and the second control path 120 are independent from one another, each of the first and second control paths 118, 120 may provide independent control to the first transistor 102 and to the second transistor 104, respectively. Thus, the first transistor 102 and the second transistor 104 may be separately or independently controlled in order to separately adjust each transistor (or set of transistors) to substantially match a desired output impedance at the respective output terminal (e.g., at the first output terminal 106 and at the second output terminal 108). In a particular embodiment, the first output terminal 106 and the second output terminal 108 together form a differential output. The differential output formed by the first output terminal 106 and the second output terminal 108 may be coupled to transmission lines which terminate at a receiving device or other destination device. An example of a receiver device coupled to transmission lines is the receiver 370 described with respect to FIG. 3.

Figure 2:
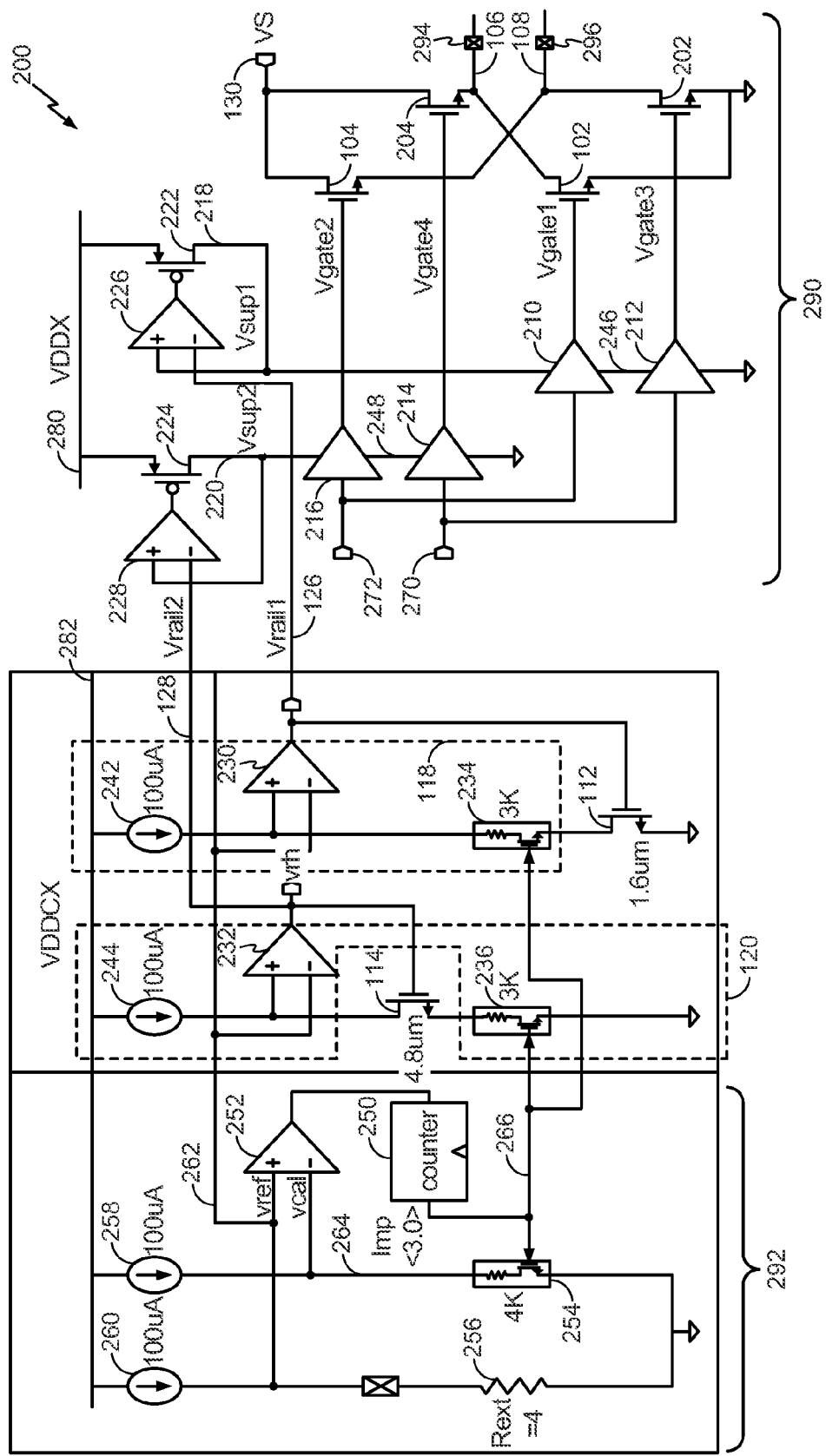
FIG. 2 is a diagram of a particular implementation of the balanced single-ended impedance control system of FIG. 1.

Referring to FIG. 2, a particular implementation of the balanced single-ended impedance control system 100 of FIG. 1 is shown and is designated as 200. The system 200 includes an impedance calibration block 292, a first control path 118, and a second control path 120. The impedance calibration block 292 includes a calibration reference transistor 254 and a calibration resistor 256. The calibration resistor 256 is coupled to a first current source 260 at a first node (vref) 262. The calibration reference transistor 254 is coupled to a second current source 258 via a second node (vcal) 264. The first node 262 and the second node 264 are inputs to a calibration operational amplifier 252. The impedance calibration block 292 further includes a counter 250 that generates impedance control signals 266. For example, the impedance control signals 266 may include four signals, such as imp<3:0>. The impedance control signals 266 are generated by the counter 250 based on an output of the calibration operational amplifier 252. The impedance control signals 266 are provided to the calibration reference transistor 254. The impedance control signals 266 are also provided to a first reference transistor 234 and to a second reference transistor 236. The first reference transistor 234 is within the first control path 118 and the second reference transistor 236 is within the second control path 120.

The impedance calibration block 292 is configured to provide the reference voltage signal (vref) at the first node 262 to the first control path 118 and to the second control path 120.

The first control path 118 includes a first current source 242, a first operational amplifier 230, and the first reference transistor 234. The second control path 120 includes a second current source 244, a second operational amplifier 232, and the second reference transistor 236. The first reference transistor 234 is coupled to the third transistor 112, and the second reference transistor 236 is coupled to the fourth transistor 114.

The system 200 further includes an output stage 290 that is responsive to the first control path 118, the second control path 120, and the impedance calibration block 292. The output stage 290 includes various components. The output stage 290 includes a first operational amplifier 226 and a second operational amplifier 228. The first operational amplifier 226 is coupled to a fifth transistor 222, and the second operational amplifier 228 is coupled to a sixth transistor 224. The power supply 280 (VDDX) supplies the fifth transistor 222 and the sixth transistor 224. The output stage 290 further includes a first buffer 210, a second buffer 216, a third buffer 212, and a fourth buffer 214. The first buffer 210 is coupled at its output to the first transistor 102 and is further coupled at its input to an input 272. The first transistor 102 is further coupled to the output terminal 106, which in turn is coupled to a first pad 294. The first transistor 102 has a terminal that is coupled to ground.

The second buffer 216 is coupled at its output to the second transistor 104 and is further coupled at its input to an input 272. The second transistor 104 is further coupled to the output terminal 108, which in turn is coupled to a second pad 296. The first transistor 104 has a terminal that is coupled to a driver voltage supply at node 130.

The output stage 290 further includes a seventh transistor 202 that is coupled to the second output terminal 108 that is in turn coupled to the second pad 296. The seventh transistor 202 is further coupled to an output of the third buffer 212. The third buffer 212 is coupled at its input to the input 270 and is further coupled at its output to the seventh transistor 202.

The output stage 290 further includes an eighth transistor 204 that is coupled to the first output terminal 106 that is in turn coupled to the first pad 294. The eighth transistor 204 is further coupled to an output of the fourth buffer 214. The fourth buffer 214 is coupled at its input to the input 270 and is further coupled at its output to the eights transistor 204.

In a particular embodiment, the third buffer 212 is coupled to the first buffer 210 via a line 246 as shown. The line 246 is coupled to line 218 through the first buffer 210. In an alternative embodiment, the line 246 may be coupled to the line 218 without passing through the first buffer 210.

In a particular embodiment, the fourth buffer 214 is coupled to the second buffer 216 via a line 248 as shown. The line 248 is coupled to a line 220 through the second buffer 216. In an alternative embodiment, the line 248 may be coupled to the line 220 without passing through the second buffer 216.

The fifth transistor 222 generates a first supply voltage (Vsup1) that is provided to the first buffer 210 via the line 218 and to the third buffer 212 via the line 246. Similarly, the sixth transistor 224 generates a second supply voltage (Vsup2) that is provided to the second buffer 216 via the line 220 and to the fourth buffer 214 via the line 248.

In a particular embodiment, a first rail voltage (Vrail1) is provided by the first control path 118 to the first operational amplifier 226 via the line 126. The first supply voltage (Vsup1), which is generated based on the first rail voltage (Vrail1) on the line 126, is provided to the first buffer 210 via the line 218. The first buffer 210 provides the first gate control voltage (Vgate1) to the gate of the first transistor 102. The first supply voltage (Vsup1) is further provided to the third buffer 212 via the line 246. The third buffer 212 provides a third gate control voltage (Vgate3) to the gate of the seventh transistor 202. While the line 246 is coupled to the first buffer 210 in FIG. 2, in alternative embodiments, the first supply voltage (Vsup1) may be provided to the line 246 without going through the first buffer 210. For example, the line 246 may be connected to the line 218.

In a particular embodiment, a second rail voltage (Vrail2) is provided by the second control path 120 to the second operational amplifier 228 via the line 128. The second supply voltage (Vsup2), which is generated based on the second rail voltage (Vrail2) on the line 128, is provided to the second buffer 216 via the line 220. The second buffer 216 provides the second gate control voltage (Vgate2) to the gate of the second transistor 104. The second supply voltage (Vsup2) is further provided to the fourth buffer 214 via the line 248. The fourth buffer 214 provides the fourth gate control voltage (Vgate4) to the gate of the eighth transistor 204. While the line 248 is coupled to the second buffer 216 in FIG. 2, in alternative embodiments, the second supply voltage (Vsup2) may be provided to the line 248 without going through the second buffer 216. For example, the line 248 may be connected to the line 220.

It should be noted that the first transistor 102 is coupled to the eighth transistor 204 at the first output terminal 106, which is in turn coupled to the first pad 294. Further, the second transistor 104 is coupled to the seventh transistor 202 at the second output terminal 108, which is in turn coupled to the second pad 296. A driver supply voltage at node 130 is provided to the second transistor 104 and to the eighth transistor 204.

During operation, the first control path 118, responsive to change in impedance of the third transistor 112, adjusts the first rail voltage (Vrail1) that is provided to the first operational amplifier 226. The first operational amplifier 226 drives a gate of the fifth transistor 222 that is coupled to the power supply 280. The fifth transistor 222 provides the first supply voltage (Vsup1) to the first buffer 210 and to the third buffer 212. The first buffer 210, in turn, drives the gate of the first transistor 102 and the third buffer 212 drives the gate of the seventh transistor 202. The first transistor 102, responsive to the first gate control voltage (Vgate1) from the first buffer 210, provides an output to the first output terminal 106, which is coupled to the first pad 294. The seventh transistor 202, responsive to the third gate control voltage (Vgate3) from the third buffer 212, provides an output to the second output terminal 108, which is coupled to the second pad 296.

As described with respect to the first control path 118 and the various circuits driven by the first control path 118, the first control path 118 may dynamically adjust the first rail voltage (Vrail1) on the line 126, which in turn adjusts the first supply voltage (Vsup1) and thereby adjusts the impedance of the first transistor 102 and the impedance of the seventh transistor 202. The impedance of the first transistor 102, which also depends on device characteristics of the first transistor 102, affects the output impedance of the first output terminal 106. Similarly, the impedance of the seventh transistor 202, which also depends on device characteristics of the seventh transistor 202, affects the output impedance of the second output terminal 108. In a particular embodiment, the first transistor 102 and the second transistor 104 operate in a deep triode region, where a metal-oxide-semiconductor (MOS) transistor can operate as a small resistor. The resistance value of the transistor in the deep triode region depends on the gate control voltage provided to the gate of the transistor. Similarly, the seventh transistor 202 and the eighth transistor 204 operate in the deep triode region.

In particular embodiment, the first control path 118 drives the first operational amplifier 226 which in turn provides an output to the fifth transistor 222. The first supply voltage (Vsup1) is generated by the fifth transistor 222 based on the first rail voltage (Vrail1) on the line 126 and (Vsup1) is provided to the first buffer 210 and to the third buffer 212. The first gate control voltage (Vgate1), which depends on the first supply voltage (Vsup1), affects the impedance of the first transistor 102. Similarly, the third gate control voltage (Vgate3), which depends on the first supply voltage (Vsup1), affects the impedance of the seventh transistor 202. Thus, the first control path 118 dynamically adjusts the impedance at the first output terminal 106 and the impedance at the second terminal 108.

In a similar manner, the second control path 120, responsive to a change in impedance of the fourth transistor 114, adjusts the second rail voltage (Vrail2) that is provided to the second operational amplifier 228. The second operational amplifier 228 drives a gate of the sixth transistor 224 that is coupled to the power supply 280. The sixth transistor 224 provides the second supply voltage (Vsup2) to the second buffer 216 and to the fourth buffer 214. The second buffer 216, in turn, drives the gate of the second transistor 104, and the third buffer 214 drives the gate of the eighth transistor 204. The second transistor 104, responsive to the second gate control voltage (Vgate2) from the second buffer 216, provides an output to the second output terminal 108, which is coupled to the second pad 296. The eighth transistor 204, responsive to the fourth gate control voltage (Vgate4) from the fourth buffer 214, provides an output to the second output terminal 108, which is coupled to the second pad 296.

As described with respect to the second control path 120 and the various circuits driven by the second control path 120, the second control path 120 may dynamically adjust the second rail voltage (Vrail2) on the line 128, which in turn adjusts the second supply voltage (Vsup2) and thereby adjusts an impedance of the second transistor 104 and an the impedance of the eighth transistor 204. The impedance of the second transistor 104, which also depends on device characteristics of the second transistor 104, affects the output impedance at the second output terminal 108. Similarly, the impedance of the eighth transistor 204, which also depends on device characteristics of the eighth transistor 204, affects the output impedance at the first output terminal 106.

The second control path 120 drives the second operational amplifier 228, which in turn provides an output to the sixth transistor 224. The second supply voltage (Vsup2) is generated by the sixth transistor 224 based on the second rail voltage (Vrail2) on the line 128 and is provided to the second buffer 216 and to the fourth buffer 212. The second gate control voltage (Vgate2), which depends on the second supply voltage (Vsup2), affects the impedance of the second transistor 104. Similarly, the fourth gate control voltage (Vgate4), which depends on the second supply voltage (Vsup2), affects the impedance of the eighth transistor 204. Thus, the second control path 120 dynamically adjusts the impedance at the first output terminal 106 and the impedance at the second output terminal 108.

The impedance of the third transistor 112 depends on the device characteristics of the third transistor 112 which are affected by variations in manufacturing process. Similarly, the impedance of the fourth transistor 114 depends on the device characteristics of the fourth transistor 114 which are also affected by variations in manufacturing process. Further, the impedance of the third transistor 112 and the impedance of the fourth transistor 114 are affected by variations in voltage and temperature. The first transistor 102, the seventh transistor 202, and the third transistor 112, which all have similar device characteristics, respond similarly to a particular voltage level that is applied to the gate of each transistor. Similarly, the second transistor 104, the eighth transistor 204, and the fourth transistor 114, which all have similar device characteristics, respond similarly to a particular voltage level that is applied to the gate of each transistor. Thus, the first control path 118 and the second control path 120, responsive to a change in temperature and voltage that affect the impedance of the third and fourth transistors 112 and 114, dynamically adjust rail voltages (Vrail1) and (Vrail2) in order to control an output impedance at each output terminal 106 and 108.

In a particular embodiment, the first control path 118 is operable to adjust the first rail voltage (Vrail1) on the line 126 during a first data transmission, and the second control path 120 is operable to adjust the second rail voltage (Vrail2) on the line 128 during a second data transmission. In a particular illustrative embodiment, the first data transmission and the second data transmission occur substantially simultaneously. In other embodiments, the first and second data transmissions may occur at different times.

In addition, the first and second control paths 118, 120 receive control signals 266 generated by the impedance calibration block 292. The controls signals 266 are provided to the calibration reference transistor 254 to adjust an impedance of the calibration reference transistor 254. Thus, the adjusted impedance of the calibration reference transistor 254 depends on the value of the calibration resistor 256.

The controls signals 266 are also provided to the first reference transistor 234 and to the second reference transistor 236 to adjust an impedance of the first reference transistor 234 and an impedance of the second reference transistor 236, respectively. In a particular embodiment, the impedance of the calibration reference transistor 254 is approximately equal to the sum of the impedances of the third reference transistor 112 and the first reference transistor 234. The impedance of the calibration reference transistor 254 is also approximately equal to the sum of the impedances of the fourth reference transistor 114 and the second reference transistor 236. The first and the second control paths 118, 120 are responsive to the control signals 266 that are determined based on the value of the calibration reference transistor 254, which depends on the value of the calibration resistor 256. Thus, the impedance control block 292 may provide impedance control signals 266 to calibrate impedance levels in order to control impedances of the first output terminal 106 and the second output terminal 108.

Thus, circuitry is provided to dynamically adapt to voltage and temperature variations and to maintain impedance at or close to a desired impedance value, such as 50 ohms, for each of the output terminals.

While the first pad 294 and the second pad 296 are shown coupled to the first output terminal and the second output terminal respectively, in another embodiment, the first pad 294 and the second pad 296 are omitted. Those of skill would further appreciate that while the first transistor 102, the second transistor 104, the seventh transistor 202, and the eighth transistor 204 are shown as n-channel metal-oxide-semiconductor (NMOS) transistors, in some embodiments, p-channel metal-oxide-semiconductor (PMOS) transistors may be used with corresponding changes in other components including the third transistor 112 and the fourth transistor 114. Further, buffers 210, 212, 214, and 218 may be inverting buffers. Additionally, while the transistors in FIG. 2 are shown as PMOS or NMOS transistors, transistors other than metal-oxide-semiconductor (MOS) transistors may be used.

Figure 3:
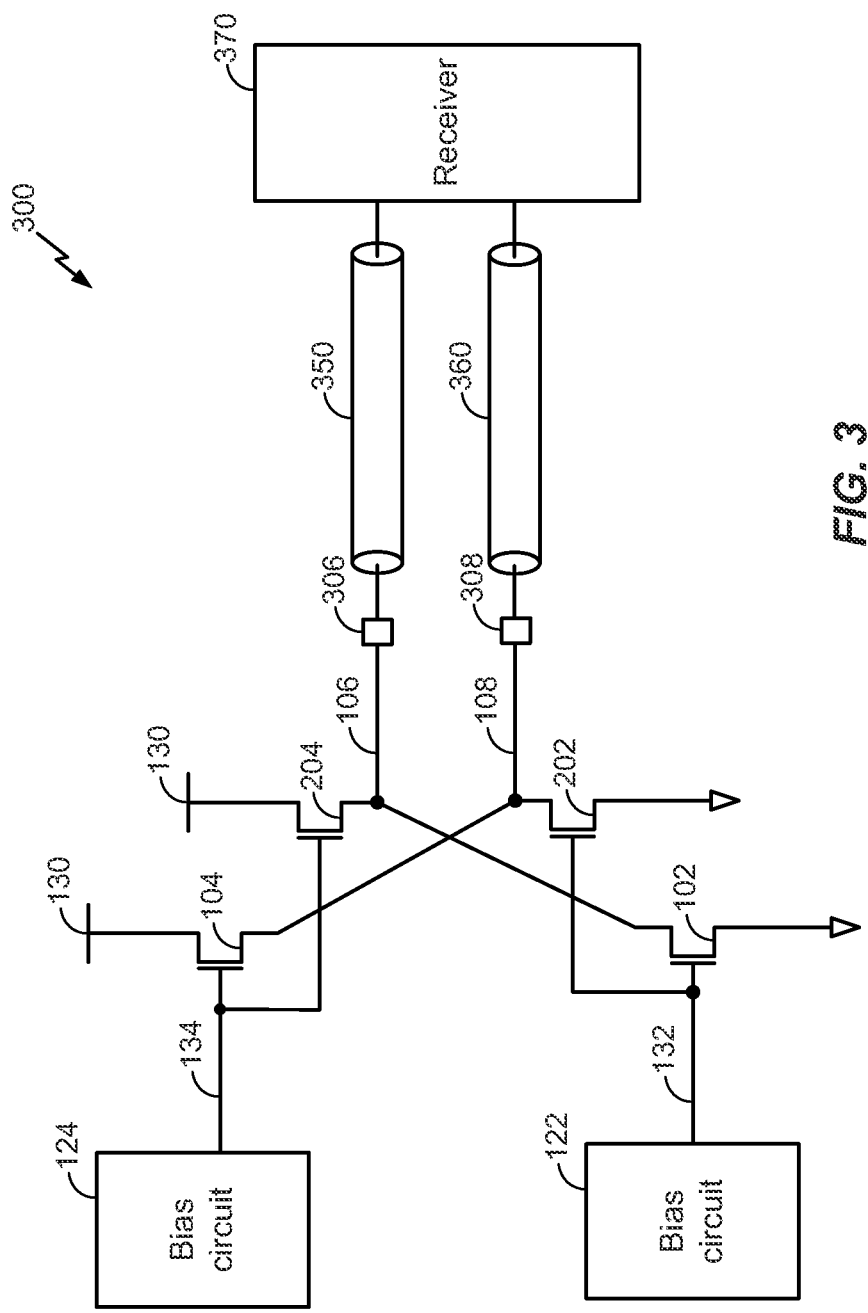
FIG. 3 is a diagram of a particular application of the system of FIGS. 1 and 2.

Referring to FIG. 3, further detail of a particular application of the system of FIGS. 1 and 2 is shown and is designated 300. The system 300 includes a first transmission line 350 and a second transmission line 360. The first and second transmission lines 350, 360 are coupled to a destination receiver 370. For example, the destination receiver 370 may be an electronic device, such as a computer, a device including a processor, or another circuit. The first pad 306 is configured to be coupled to the first transmission line 350, and the second pad 308 is configured to be coupled to the second transmission line 360. The first pad 306 is coupled to the first output terminal 106, and the second pad 308 is coupled to the second output terminal 108. Each of the other devices shown in FIG. 3 is a component as described above with respect to either FIG. 1 or FIG. 2. In addition, such components operate as described with respect to FIG. 1 or FIG. 2 to control output impedances at the first output terminal 106 and the second output terminal 108.

During operation, an output signal of the first terminal 106 is provided to the first pad 306, and the output signal is provided to the first transmission line 350 for transmission to the receiver 370. A second output signal of the second output terminal 108 is provided to the second transmission line 360 via the second pad 308, and the second output signal is propagated over the second transmission line 360 to the destination receiver 370. Thus, output signals may be provided to the first output terminal 106 for transmission to the first transmission line 350 to the receiver 370, and output signals may be provided over the second output terminal 108 and transmitted over the second transmission line 360 to the receiver 370. In a particular illustrative embodiment, the first transmission line 350 and the second transmission line 360 form a differential transmission line pair for communication of signals to the receiver 370.

The output impedance at the first output terminal 106 generally matches the impedance of the first transmission line 350. Similarly, the desired output impedance at the second output terminal 108 generally matches the impedance of the first transmission line 360. By controlling and maintaining an output impedance at the first output terminal 106 that matches or substantially matches a desired output impedance, reflection loss due to impedance mismatch between the first output terminal 106 and the first transmission line 350 may be reduced. Similarly, by controlling and maintaining an output impedance at the second output terminal 108 that matches or substantially matches a desired output impedance, reflection loss due to impedance mismatch between the second output terminal 108 and the first transmission line 360 may be reduced.

Figure 4:
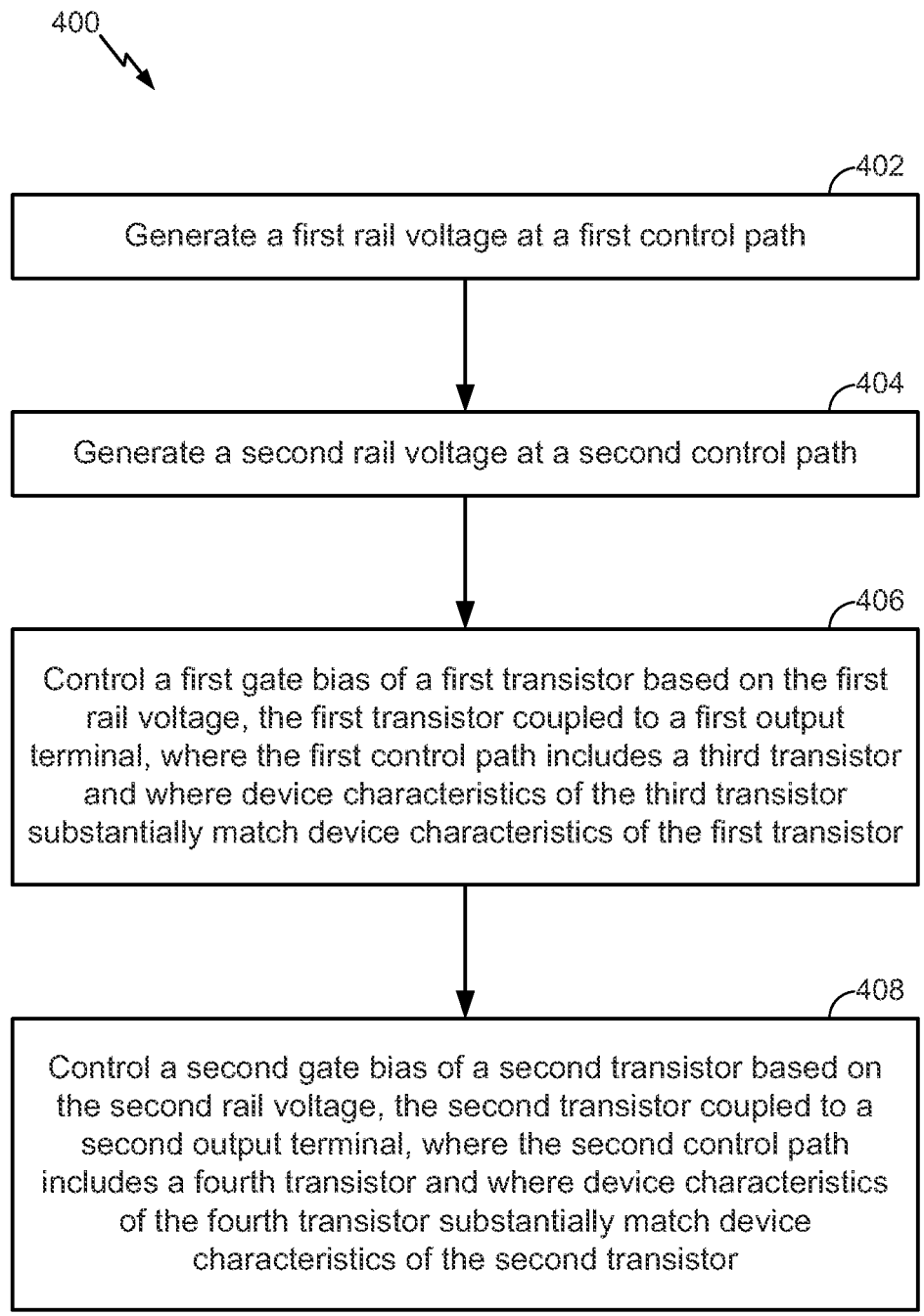
FIG. 4 is a flow chart of a particular illustrative embodiment of a method of operating a balanced single-ended impedance control system.

Referring to FIG. 4, a particular illustrative embodiment of a method of operating a balanced single-ended impedance control system is illustrated. The method includes generating a first rail voltage at a first control path, at 402. For example, the first rail voltage (Vrail1) on the line 126 may be generated at the first control path 118. The method further includes generating a second rail voltage at a second control path, at 404. For example, the second rail voltage (Vrail2) on the line 128 may be generated at the second rail control path 120. The method further includes controlling a first gate control voltage of a first transistor based on the first rail voltage, at 406. For example, the first gate control voltage (Vgate1) (in FIGS. 1 and 2) is controlled based on the first rail voltage (Vrail1) on the line 126 (in FIGS. 1 and 2). The first transistor is coupled to a first output terminal. For example, the first transistor 102 is coupled to the first output terminal 106. The first control path includes a third transistor. For example, the first control path 118 includes the third transistor 112. Device characteristics of the third transistor substantially match device characteristics of the first transistor, as shown at 406. For example, device characteristics of the first transistor 102 match or substantially match device characteristics of the third transistor 112. The first gate control voltage (Vgate1) may be applied to the gate of the first transistor 102 by the first bias circuit 122 over the connection line 132.

The method further includes controlling a second gate control voltage of a second transistor based on the second rail voltage, at 408. For example, a second gate control voltage (Vgate2) may be applied by the second bias circuit 124 to the second transistor 104 via the line 134. The second transistor is coupled to a second output terminal. For example, the second transistor 104 is coupled to the second output terminal 108. The second control path includes a fourth transistor, and device characteristics of the fourth transistor substantially match device characteristics of the second transistor. For example, the second control path 118 includes the fourth transistor 114, and device characteristics of the fourth transistor 114 match or substantially match device characteristics of the second transistor 104.

The method of FIG. 4 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 4 can be performed by circuitry (e.g., a buffer) controlled by a processor that executes instructions, as described with respect to FIG. 5.

Figure 5:
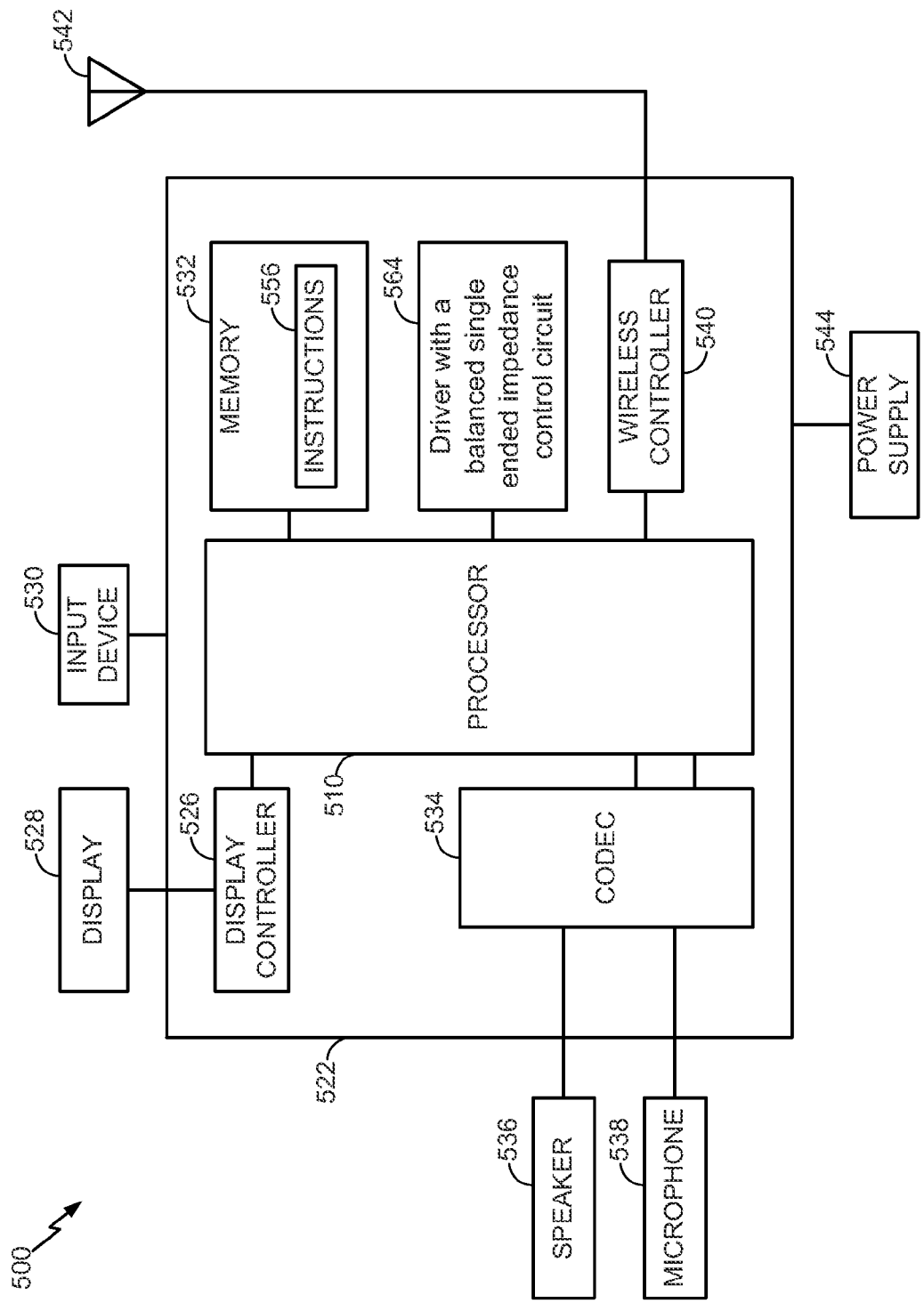
FIG. 5 is a block diagram of a wireless device including a balanced single-ended impedance control system.

Referring to FIG. 5, a block diagram of a particular illustrative embodiment of a wireless communication device is depicted and generally designated 500. The device 500 includes a processor unit 510, such as a digital signal processor (DSP), coupled to a memory 532. The device 500 may include one or more drivers (e.g., a driver with a balanced single-ended impedance control circuit 564) coupled to the processor unit 510. In an illustrative embodiment, the driver with a balanced single-ended impedance control circuit 564 may correspond to the balanced single-ended impedance control system 100 of FIG. 1, and to the balanced single-ended impedance control system 200 of FIG. 2, or may operate according to the method of FIG. 4, or any combination thereof.

For example, the wireless communication device 500 may be coupled to transmission lines via one or more drivers (e.g., the driver with a balanced single-ended impedance control circuit 564). The transmission lines (e.g., transmission lines 350 and 360 shown in FIG. 3) may also be coupled to a receiving device (e.g., receiving device 370 of FIG. 3) on a different end of the transmission lines. For example, the wireless communication device 500 may receive data via a wireless medium and may send data to a receiving device (e.g., an external computer) via the transmission lines that are coupled the wireless communication device 500.

The memory 532 may be a non-transitory computer readable medium storing computer-executable instructions 556 that are executable by the processor 510 to cause the processor 510 to send a data signal or a clock signal to the driver with a balanced single-ended impedance control circuit 564.

The memory 532 may include computer readable instructions. For example, the memory 532 may include instructions to transmit data via the driver with a balanced single-ended impedance control circuit 564. The driver with a balanced single-ended impedance control circuit 564 may receive data from the processor 510.

FIG. 5 also shows a display controller 526 that is coupled to the digital signal processor 510 and to a display 528. A coder/decoder (CODEC) 534 can also be coupled to the digital signal processor 510. A speaker 536 and a microphone 538 can be coupled to the CODEC 534.

FIG. 5 also indicates that a wireless controller 540 can be coupled to the digital signal processor 510 and to a wireless antenna 542. In a particular embodiment, the DSP 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

While FIG. 5 illustrates a particular embodiment of a wireless device 500, one or more drivers (e.g., the driver with a balanced single-ended impedance control circuit 564) may be integrated in other electronic devices including a set top box, a music player, a video player, an entertainment unit, a navigation device, a communications device, a personal digital assistant (PDA), a fixed location data unit, and a computer integrated.

In conjunction with the described embodiments, a system is disclosed that may include means for generating a first rail voltage, such as the control path 118 of FIG. 1 or FIG. 2, one or more other devices or circuits configured to generate the first rail voltage, or any combination thereof. The system may also include means for generating a second rail voltage, such as the control path 120 of FIG. 1 or FIG. 2, one or more other devices or circuits configured to generate a second rail voltage, or any combination thereof.

The system may also include means for controlling a first gate control voltage of a first transistor based on a first rail voltage, such as the bias circuit 122 of FIG. 1, the buffer 210 of FIG. 2, the bias circuit 122 of FIG. 3, one or more other devices or circuits configured to control a first gate control voltage of a first transistor based on a first rail voltage, or any combination thereof.

The system may also include means for controlling a second gate control voltage of a second transistor based on the second rail voltage, such as the bias circuit 124 of FIG. 1, the buffer 216 of FIG. 2, the bias circuit 124 of FIG. 3, one or more other devices or circuits configured to control a second gate control voltage of a second transistor based on a second rail voltage, or any combination thereof.

Figure 6:
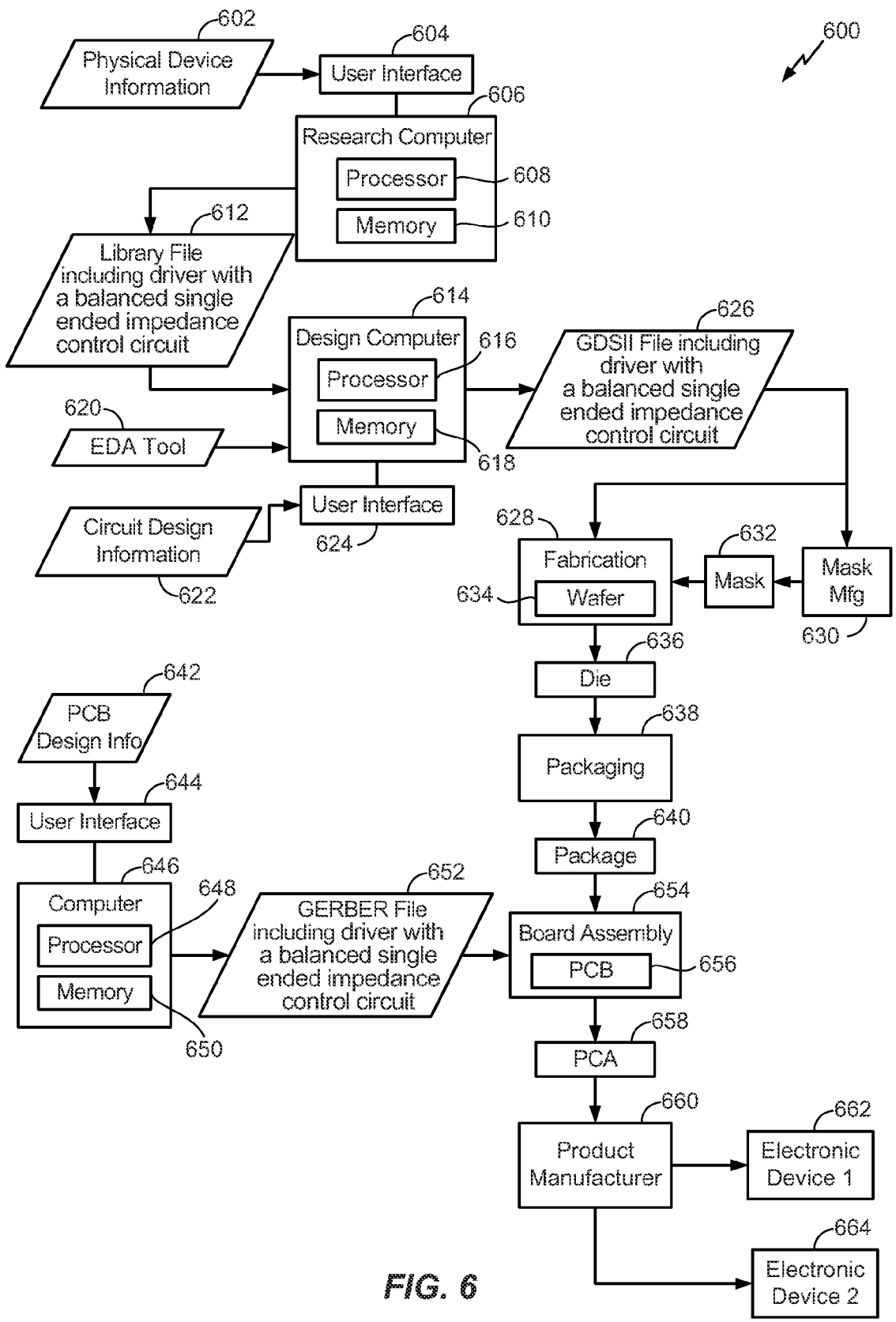
FIG. 6 is a data flow diagram of a particular illustrative embodiment of a manufacturing process to manufacture electronic devices that include a balanced single-ended impedance control system.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in any of the electronic devices described herein. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as a device including the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including a device that includes the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof, of the library file 612. For example, a user of the design computer 614 may enter circuit design information 622 via a user interface 624 coupled to the design computer 614. The circuit design information 622 may include design information representing at least one physical property of a semiconductor device, such as the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof, in addition to other circuits or information. To illustrate, the data file may include information corresponding to a system-on-chip (SOC) that includes the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof, and that also includes additional electronic circuits and components within the SOC.

The GDSII file 626 may be received at a fabrication process 628 to manufacture the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes a circuit including a device that includes the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer, into which the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry.

A device that includes the control path 118 of FIG. 1, the control path 120 of FIG. 1, the bias circuit 122 of FIG. 1, the bias circuit 124 of FIG. 1, the transistor 102 of FIG. 1, the transistor 104 of FIG. 1, the output stage 290 of FIG. 2, the control path 118 of FIG. 2, the control path 120 of FIG. 2, the impedance calibration block 292 of FIG. 2, or any combination thereof, may be fabricated, processed, and incorporated into an electronic device, as described in the illustrative process 600. One or more aspects of the embodiments disclosed with respect to FIGS. 1-3 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit for generating a balanced single-ended impedance, the circuit comprising:
   a first transistor coupled to a first output terminal;
   a second transistor coupled to a second output terminal;
   a third transistor, wherein device characteristics of the third transistor substantially match device characteristics of the first transistor;
   a fourth transistor, wherein device characteristics of the fourth transistor substantially match device characteristics of the second transistor;
   a first control path that is coupled to the third transistor and that provides a first rail voltage to control a first gate control voltage of the first transistor;
   a second control path that is coupled to the fourth transistor and that provides a second rail voltage to control a second gate control voltage of the second transistor; and
   a first input terminal configured to provide a first gate control signal to the first transistor and to the second transistor.

2. The circuit of claim 1, wherein the device characteristics of the first transistor comprise an impedance of the first transistor.

3. The circuit of claim 1, wherein the device characteristics of the first transistor comprise a length of a channel region of the first transistor and a width of the channel region of the first transistor.

4. The circuit of claim 1, wherein the device characteristics of the second transistor comprise a length of a channel region of the second transistor and a width of the channel region of the second transistor.

5. The circuit of claim 1, wherein the first output terminal is coupled to a first transmission line, wherein the second output terminal is coupled to a second transmission line, wherein the first transmission line has a first impedance and wherein the second transmission line has a second impedance.

6. The circuit of claim 5, wherein the first impedance is approximately 50 ohms and wherein the second impedance is approximately 50 ohms.

7. The circuit of claim 1, wherein the first control path comprises a first current source, a first operational amplifier and a first reference transistor, and wherein the second control path comprises a second current source, a second operational amplifier and a second reference transistor.

8. The circuit of claim 1, wherein the first control path is operable to adjust the first rail voltage and wherein the second control path is operable to adjust the second rail voltage.

9. The circuit of claim 8, wherein the first control path is operable to adjust the first rail voltage during a first data transmission, wherein the second control path is operable to adjust the second rail voltage during a second data transmission, and wherein the first data transmission and the second data transmission occur substantially simultaneously.

10. The circuit of claim 8, further comprising a first reference transistor coupled to the third transistor and a second reference transistor coupled to the fourth transistor, and further comprising an impedance calibration block to generate impedance control signals, wherein the impedance control signals are provided to the first reference transistor and to the second reference transistor.

11. The circuit of claim 10, wherein the impedance calibration block is configured to provide a reference voltage signal to the first control path and to the second control path.

12. The circuit of claim 11, wherein the impedance calibration block comprises a calibration reference transistor and a calibration resistor, wherein the calibration resistor is coupled to a first current source via a first node, wherein the calibration reference transistor is coupled to a second current source via a second node, wherein the first node and the second node are coupled to a calibration operational amplifier, wherein the impedance calibration block includes a counter that generates the impedance control signals, wherein the impedance control signals are generated by the counter based on an output of the calibration operational amplifier, and wherein the impedance control signals are provided to the calibration reference transistor.

13. The circuit of claim 8, wherein a first supply voltage generated based on the first rail voltage is applied to a first buffer that is coupled to a gate of the first transistor.

14. The circuit of claim 13, wherein the first rail voltage is input to a first operational amplifier coupled to a fifth transistor, the fifth transistor generating the first supply voltage.

15. The circuit of claim 13, wherein a second supply voltage generated based on the second rail voltage is applied to a second buffer that is coupled to a gate of the second transistor.

16. The circuit of claim 15, wherein the second rail voltage is input to a second operational amplifier coupled to a sixth transistor, the sixth transistor generating the second supply voltage.

17. The circuit of claim 1, further comprising a first pad coupled to the first output terminal and configured to be coupled to a first terminal of a first transmission line and a second pad coupled to the second output terminal and configured to be coupled to a second terminal of a second transmission line.

18. The circuit of claim 1, further comprising:
   a seventh transistor coupled to the second transistor and to the second output terminal, wherein a seventh gate control voltage of the seventh transistor is controlled by the first rail voltage; and
   an eighth transistor coupled to the first transistor and to the first output terminal, wherein an eighth gate control voltage of the eighth transistor is controlled by the second rail voltage, and wherein a driver supply voltage is coupled to the second transistor and to the eighth transistor.

19. The circuit of claim 18, further comprising:
   a third buffer coupled to the seventh transistor; and
   a fourth buffer coupled to the eighth transistor, wherein the third buffer is supplied by a third supply voltage that is generated based on the first rail voltage, and wherein the fourth buffer is supplied by a fourth supply voltage that is generated based on the second rail voltage.

20. The circuit of claim 1, wherein the first transistor, the second transistor, the third transistor, and the fourth transistor are integrated in at least one semiconductor die.

21. The circuit of claim 1, further comprising at least one of: a set top box, a music player, a video player, an entertainment unit, a navigation device, a communications device, a personal digital assistant (PDA), a fixed location data unit, or a computer, into which the first transistor is integrated.

22. The circuit of claim 1, wherein the first transistor is configured to provide the first gate control signal to the first output terminal with a voltage controlled by the first gate control voltage and wherein the second transistor is configured to provide the first gate control signal to the second output terminal with a voltage controlled by the second gate control voltage.

23. The circuit of claim 15, wherein the first input terminal is coupled to an input of the first buffer and wherein the first input terminal is coupled to an input of the second buffer.

24. The circuit of claim 18, further comprising a second input terminal configured to provide a second gate control signal to the seventh transistor and to the eighth transistor, wherein the seventh transistor is configured to provide the second gate control signal to the second output terminal with a voltage controlled by the first gate control voltage and wherein the eighth transistor is configured to provide the second gate control signal to the first output terminal with a voltage controlled by the second gate control voltage.

25. The circuit of claim 19, further comprising a second input terminal configured to provide a second gate control signal to the seventh transistor and to the eighth transistor, wherein the second input terminal is coupled to an input of the third buffer and wherein the second input terminal is coupled to an input of the fourth buffer.

26. A method of generating a balanced single-ended impedance, the method comprising:
generating a first rail voltage at a first control path;
generating a second rail voltage at a second control path;
controlling a first gate control voltage of a first transistor based on the first rail voltage, the first transistor coupled to a first output terminal, wherein the first control path is coupled to a third transistor and wherein device characteristics of the third transistor substantially match device characteristics of the first transistor;
controlling a second gate control voltage of a second transistor based on the second rail voltage, the second transistor coupled to a second output terminal, wherein the second control path is coupled to a fourth transistor and wherein device characteristics of the fourth transistor substantially match device characteristics of the second transistor;
providing a gate control signal to the first transistor; and
providing the gate control signal to the second transistor.

27. The method of claim 26, wherein the device characteristics of the first transistor comprise an impedance of the first transistor.

28. The method of claim 26, wherein the device characteristics of the first transistor comprise a length of a channel region of the first transistor and a width of the channel region of the first transistor.

29. The method of claim 26, wherein the first control path comprises a first current source, a first operational amplifier and a first reference transistor, and wherein the second control path comprises a second current source, a second operational amplifier and a second reference transistor.

30. The method of claim 26, wherein a first supply voltage generated based on the first rail voltage is applied to a first buffer that is coupled to a gate of the first transistor.

31. The method of claim 30, wherein a second supply voltage generated based on the second rail voltage is applied to a second buffer that is coupled to a gate of the second transistor.

32. The method of claim 26, wherein controlling the first gate control voltage of the first transistor is performed at a processor integrated into an electronic device.

33. An apparatus comprising:
means for generating a first rail voltage;
means for generating a second rail voltage;
means for controlling a first gate control voltage of a first transistor based on the first rail voltage, the first transistor coupled to a first output terminal, wherein the means for generating the first rail voltage includes a third transistor and wherein device characteristics of the third transistor substantially match device characteristics of the first transistor; and
means for controlling a second gate control voltage of a second transistor based on the second rail voltage, the second transistor coupled to a second output terminal, wherein the means for generating the second rail voltage includes a fourth transistor and wherein device characteristics of the fourth transistor substantially match device characteristics of the second transistor; and
means for providing a gate control signal to the first transistor and to the second transistor.

34. The apparatus of claim 33, wherein the device characteristics of the first transistor comprise an impedance of the first transistor.

35. The apparatus of claim 33, wherein the device characteristics of the first transistor comprise a length of a channel region of the first transistor and a width of the channel region of the first transistor.

36. The apparatus of claim 33, wherein a first supply voltage generated based on the first rail voltage is applied to a first buffer that is coupled to a gate of the first transistor.

37. The apparatus of claim 36, wherein a second supply voltage generated based on the second rail voltage is applied to a second buffer that is coupled to a gate of the second transistor.

38. A method comprising:
a step for generating a first rail voltage at a first control path;
a step for generating a second rail voltage at a second control path;
a step for controlling a first gate control voltage of a first transistor based on the first rail voltage, the first transistor coupled to a first output terminal, wherein the first control path is coupled to a third transistor and wherein device characteristics of the third transistor substantially match device characteristics of the first transistor;
a step for controlling a second gate control voltage of a second transistor based on the second rail voltage, the second transistor coupled to a second output terminal, wherein the second control path is coupled to a fourth transistor and wherein device characteristics of the fourth transistor substantially match device characteristics of the second transistor;
a step for providing a gate control signal to the first transistor; and
a step for providing the gate control signal to the second transistor.

39. The method of claim 38, wherein the device characteristics of the first transistor comprise an impedance of the first transistor.

40. The method of claim 38, wherein the first control path comprises a first current source, a first operational amplifier and a first reference transistor, and wherein the second control path comprises a second current source, a second operational amplifier and a second reference transistor.

41. The method of claim 38, wherein controlling the second gate control voltage of the second transistor is performed by a circuit controlled by a processor integrated into an electronic device.

* * * * *